(12) United States Patent
Tong et al.

(10) Patent No.: US 11,392,748 B2
(45) Date of Patent: Jul. 19, 2022

(54) INTEGRATED CIRCUIT DESIGN USING FUZZY MACHINE LEARNING

(71) Applicant: Taiwan Semiconductor Manufacturing Company, Ltd., Hsinchu (TW)

(72) Inventors: Chao Tong, Hsinchu (TW); Qingwen Deng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/569,966

(22) Filed: Sep. 13, 2019

(65) Prior Publication Data

US 2020/0104459 A1    Apr. 2, 2020

Related U.S. Application Data

(60) Provisional application No. 62/857,383, filed on Jun. 5, 2019, provisional application No. 62/738,593, filed on Sep. 28, 2018.

(51) Int. Cl.
| | |
|---|---|
| *G06F 30/398* | (2020.01) |
| *G06N 7/02* | (2006.01) |
| *G06F 30/327* | (2020.01) |
| *G06F 30/392* | (2020.01) |
| *G06F 30/394* | (2020.01) |

(52) U.S. Cl.
CPC .......... *G06F 30/398* (2020.01); *G06F 30/327* (2020.01); *G06F 30/392* (2020.01); *G06F 30/394* (2020.01); *G06N 7/023* (2013.01)

(58) Field of Classification Search
CPC .... G06F 30/398; G06F 30/327; G06F 30/392; G06F 30/394; G06F 2115/02; G06F 30/20; G06F 30/27; G06N 7/023
See application file for complete search history.

(56) References Cited

U.S. PATENT DOCUMENTS

| | | | | |
|---|---|---|---|---|
| 5,768,479 A | * | 6/1998 | Gadelkarim | G06F 30/392 706/52 |
| 7,356,784 B1 | * | 4/2008 | Dengi | G06F 30/367 716/113 |
| 10,250,052 B2 | * | 4/2019 | Patil | H01M 10/44 |
| 10,509,883 B2 | * | 12/2019 | Yang | G06F 30/392 |
| 2002/0184603 A1 | * | 12/2002 | Hassibi | G06F 30/36 716/122 |

(Continued)

FOREIGN PATENT DOCUMENTS

| | | |
|---|---|---|
| CN | 105975644 A | 9/2016 |
| CN | 103870617 B | 4/2017 |

(Continued)

*Primary Examiner* — Stacy Whitmore

(74) *Attorney, Agent, or Firm* — Merchant & Gould P.C.

(57) ABSTRACT

Systems and methods include receiving a functional integrated circuit design and generating a plurality of place and route (PnR) layouts based on the received functional integrated circuit design and one or more integrated circuit floorplans may be generated. One or more fuzzy logic rules may be applied to analyze attributes associated with each of the generated PnR layouts, and a PnR layout of the plurality of PnR layouts having an area utilization complying with the one or more fuzzy logic rules may be generated.

20 Claims, 10 Drawing Sheets

(56) References Cited

U.S. PATENT DOCUMENTS

| | | | |
|---|---|---|---|
| 2008/0092099 A1* | 4/2008 | Lin | G06F 30/392 716/122 |
| 2008/0147231 A1 | 6/2008 | Fernandez | |
| 2009/0064083 A1* | 3/2009 | Ikeuchi | G06F 30/398 716/50 |
| 2009/0289604 A1* | 11/2009 | Carkner | H02J 7/0071 320/151 |
| 2009/0300570 A1* | 12/2009 | Chan | G06F 30/39 716/119 |
| 2009/0312996 A1* | 12/2009 | Guyaguler | E21B 49/00 703/10 |
| 2010/0005434 A1* | 1/2010 | Wang | G06F 30/398 716/106 |
| 2011/0093826 A1* | 4/2011 | White | G06F 30/392 716/112 |
| 2011/0115440 A1* | 5/2011 | Sabi | H01M 10/44 320/145 |
| 2011/0175576 A1* | 7/2011 | Uesaka | H01M 10/44 320/155 |
| 2012/0126744 A1* | 5/2012 | Kuroda | H02J 7/0071 320/107 |
| 2013/0069425 A1* | 3/2013 | Kanazawa | B60L 50/51 307/9.1 |
| 2014/0156233 A1* | 6/2014 | Wang | G06F 30/367 703/2 |
| 2014/0217968 A1* | 8/2014 | Takahashi | H02J 50/10 320/108 |
| 2015/0205901 A1* | 7/2015 | Kim | G06F 30/39 716/55 |
| 2015/0236522 A1* | 8/2015 | Zhao | H02J 7/00036 320/162 |
| 2016/0042110 A1 | 2/2016 | Lim et al. | |
| 2016/0203242 A1* | 7/2016 | Henrickson | G06F 30/392 716/104 |
| 2017/0256973 A1* | 9/2017 | Kim | H02J 7/0068 |
| 2018/0032662 A1* | 2/2018 | Adel | G03F 7/70683 |
| 2018/0068050 A1 | 3/2018 | Lin et al. | |
| 2018/0121594 A1* | 5/2018 | Studders | G06F 30/33 |
| 2019/0089175 A1* | 3/2019 | Zhang | H02J 7/0034 |
| 2019/0107642 A1* | 4/2019 | Farhadi Nia | G06N 3/088 |
| 2019/0211475 A1* | 7/2019 | Ito | G06F 30/36 |

FOREIGN PATENT DOCUMENTS

| | | |
|---|---|---|
| CN | 107665268 A | 2/2018 |
| JP | 6221586 B2 | 11/2017 |
| KR | 10-2018-0028044 A | 3/2018 |
| TW | 201411388 A | 3/2014 |
| TW | 201523309 A | 6/2015 |
| TW | 201638812 A | 11/2016 |

* cited by examiner

INTEGRATED CIRCUIT DESIGN USING FUZZY MACHINE LEARNING

RELATED APPLICATIONS

This application claims the benefit of U.S. Provisional Application Ser. No. 62/738,593, filed Sep. 28, 2018, and 62/857,383, filed Jun. 5, 2019, which are herein incorporated by reference.

BACKGROUND

Integrated circuits typically include thousands of components having complex interrelationships. These circuits are generally designed using highly automated processes known as electronic design automation (EDA). EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology. EDA can be divided into a series of stages such as synthesis, placement, routing (PnR), etc. Each of these steps can involve selecting cells from a library of cells. Typically, a very large number of different circuit designs using various cell combinations can meet a functional specification for a circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
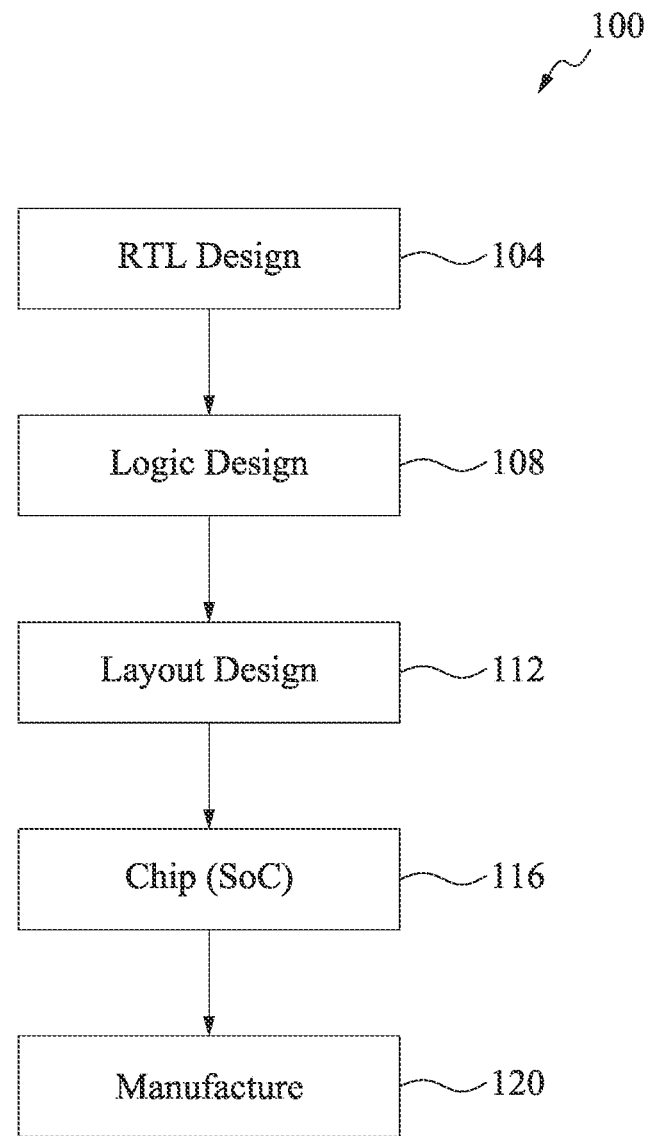
FIG. 1 is a flow diagram illustrating an example an integrated circuit design process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or/on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, various tables are provided herein, where examples are shown including illustrative variables, values, ranges, etc. Such variables, values, ranges, etc. are examples only, and other variables, values, ranges, etc. are within the scope of the disclosure.

System-on-Chip (SoC) designs have become one of the main drivers of the semiconductor technology in recent years. An SoC is an integrated circuit that integrates all, or at least many, components of a computer or other electronic system. These components typically include a central processing unit, memory, input/output ports and secondary storage—all on a single substrate. A typical SoC may contain digital, analog, mixed-signal, and often radio frequency signal processing functions, depending on the application. As they are integrated on a single electronic substrate, SoCs may consume less power and take up less area than multi-chip designs with equivalent functionality.

Integrated circuit automated design tools, such as electronic design automation (EDA), may assist in the SoC design process and may transform a circuit design into a circuit layout to be manufactured. EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology. Even when using EDA tools, area optimization can be a challenge for physical design of integrated circuit devices. For instance, getting the smallest possible physical area is desirable for many SoC products. Some approaches attempt to leverage past experiences, building a few test cases with estimated area/shape that are run through an EDA or PnR engine. When a test PnR run is complete, an engineer may analyze the result and pick a design as new baseline. If time and resources allow, additional test cases may be run. This approach requires manual effort and data analysis may lack consistency. Further, best area/shape designs are not guaranteed.

In accordance with aspects of the present disclosure, fuzzy logic machine learning algorithms are employed to automatically determine an area and shape of standard cells for a physical design. A partition with a netlist and proposed floorplan(s) is input, and based on the received input, one or more place and route (PnR) results are provided that minimize required area for the physical design.

As illustrated in FIG. 1, the process 100 for designing an SoC typically starts at a register transfer level (RTL) design phase 104 by taking detailed system specifications, such as desired function, communication, and other requirements, and transforming these system specifications into RTL design. The RTL design may be a design abstraction which models a synchronous digital circuit in terms of the flow of digital signals (data) between hardware registers, and the logical operations performed on those signals. An RTL design may be provided in the form of a programming language, such as VHDL or Verilog and typically describes the exact behavior of the digital circuits, as well as the interconnections to inputs and outputs. An RTL design may be provided for an SoC, a block, cell, and/or component of an SoC, and/or one or more sub-blocks, cells, and/or components of a hierarchical design.

Another next phase involves converting the RTL design into a logic design, such as at a logic design phase 108. The logic design phase 108 typically involves converting the RTL design into a logic design resulting in a netlist of connected logic circuits. The logic design may employ typical logic components, such as AND, OR, XOR, NAND, and NOR components as well as cells exhibiting a desired functionality from one or more libraries. In some instances, one or more intellectual property (IP) cores may be utilized and embedded within the SoC; accordingly, a netlist describing the connectivity of the various electronic components of the circuits involved in connection with the design may be generated. For example, a netlist may include a list of the electronic components in the circuit and a list of the nodes they are connected to. Similar to the RTL design phase 104, a logic design may be provided for an SoC, a block, cell, and/or component of an SoC, and/or one or more sub-blocks, cells, and/or components of a hierarchical design.

The process 100 further includes a layout design phase 112 where gate level netlists are converted to a complete physical geometric representation. Initially, the layout design phase 112 includes floor-planning which is a process of placing the various blocks, cells, and/or components and input/output pads across an area based on the design constraints. Such resources may be arranged, or "blocked" on one or more layers of the device. Placement blockages may be created at the floor planning stage resulting routing blockages function as guidelines for placement of standard cells. As one example, an SoC design may be partitioned into one or more functional blocks, or partitions. Then placement of physical elements within each block and integration of analog blocks or external IP cores may be performed. When all the elements are placed, a global and detailed routing may be run to connect all the elements together. Similar to the RTL design phase 104 and the logic design phase 108, the layout design phase 112 is conducted for an SoC, a block, cell, and/or component of an SoC, and/or one or more sub-blocks, cells, and/or components of a hierarchical design. As will be discussed further below, machine learning and fuzzy logic algorithms are employed in some examples to optimize such aspects of the design phase 108.

Figure 2A:
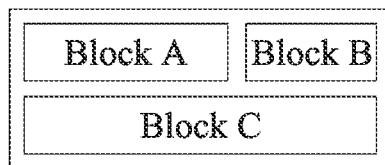
FIGS. 2A-2D are block diagrams illustrating example floorplan layouts in accordance with some embodiments.
Figure 2B:
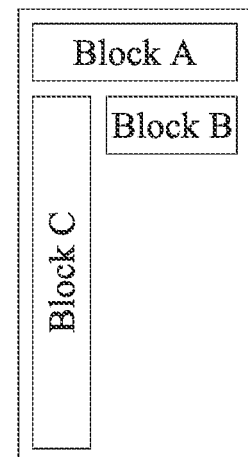

In accordance with embodiments of the present disclosure, the floor-planning phase may include the placement of various blocks, cells, and/or components in one or more configurations. In some implementations, fuzzy logic machine learning algorithms are employed to automatically determine optimum floor-plan arrangements. For example, a first configuration 204 depicts block A, block B, and block C arranged in a first manner as shown in FIG. 2A, while a second configuration shown in FIG. 2B depicts block A, block B, and block C arranged in a second manner. Block A of the first configuration 204 may perform the same functionality and/or be the same as block A of the second configuration 208. Block B of the first configuration 204 may perform the same functionality and/or be the same as block B of the second configuration 208. Block C of the first configuration 204 may perform the same functionality and/or be the same as block C of the second configuration 208. The first configuration 204 may utilize less area than the second configuration 208; however, the second configuration 208 may be beneficial if desired in instances where additional area is needed to place additional blocks, cells, and/or components as part of the existing configuration design and/or for purposes of added functionality at a later point in time.

Figure 2C:
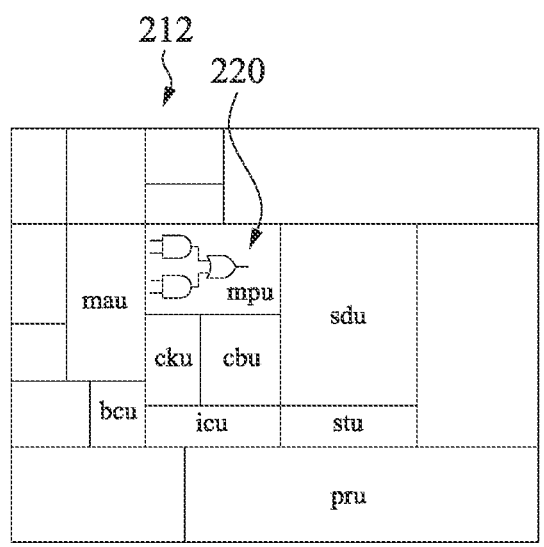
Figure 2D:
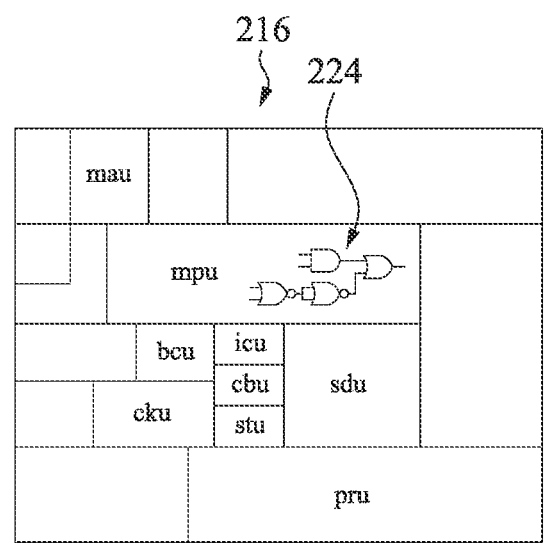

A first example SoC physical layout 212 and a second example SoC physical layout 216 are further illustrated in FIGS. 2C and 2D. The first example SoC 212 may be the same as or similar to the first configuration 204 or one or more blocks, cells, and/or components of the first configuration 204. The second example SoC 216 may be the same as or similar to the second configuration 208 or one or more blocks, cells, and/or components of the second configuration 208. In some embodiments, the first example SoC layout 212 and the second example SoC physical layout 216 perform the same functionality; however, the physical layout and design of one or more blocks may be different. For example, the first logic circuit 220 and second logic circuit 224 may perform the same function even though the circuits include different components. Accordingly, a netlist for the first logic circuit 220 may be different from a netlist for the second logic circuit 224 and therefore subsequent routing, spacing and area requirements may be different. Manually determining the optimum physical layouts and designs of the various blocks, functions, circuits can be time consuming and expensive. In accordance with aspects of the present disclosure, fuzzy logic learning algorithms may be used to automate aspects of the layout process 112.

Thus, at a manufacture phase 120 shown in FIG. 1, for example, a size of the area required to implement each of the first logic circuit 220 and second logic circuit 224 is different. Accordingly, during an area optimization phase that occurs when generating a physical design during the chip (SoC) phase 116, reducing an amount of area that is required is desirable. While there may be various implementations of a circuit and/or design to achieve a same result, disclosed examples attempt to achieve a best result while taking into consideration various design criteria such as area, timing, cross-talk, and shorts between circuits. Selecting appropriate cells to implement the desired logic or other electronic functions using a particular integrated circuit technology, determining physical arrangement and wiring interconnects for the cells, etc. can be a challenge for even experienced designers. As noted above, getting the smallest possible physical area is desirable for many SoC products. Using past experiences, iteratively using test cases to estimated area/shape, etc. requires considerable manual effort and such data analyses may lack consistency. Thus, area optimization tends to be a never-ending challenge during a physical design phase; however, a common goal remains in that a smallest physical area is a desirable criterion for SoC products. In accordance with embodiments of the present disclosure, fuzzy logic and machine learning may be utilized in addition to, or in place of, manual efforts to achieve a best smallest physical area to reduce an overall size of a SoC utilizing a processing system 300 for example, to improve efficiency and consistency.

In accordance with aspects of the present disclosure, fuzzy logic machine learning algorithms are employed to determine, in some cases automatically, the best area and shape of standard cells for a physical design to achieve the smallest physical area possible while meeting functional design requirements. In some embodiments, fuzzy logic is a form of many-valued logic in which the truth values of variables may be any real number between 0 and 1 inclusive. Fuzzy logic is often utilized to handle the concept of partial truth, where the truth value may range between completely true and completely false. That is, decisions utilizing fuzzy logic are generally based on imprecise and non-numerical information; fuzzy models or sets provide a mathematical means of representing vagueness and imprecise information. Such models are capable of recognizing, representing, manipulating, interpreting, and utilizing data and information that are vague and lack certainty.

Figure 3:
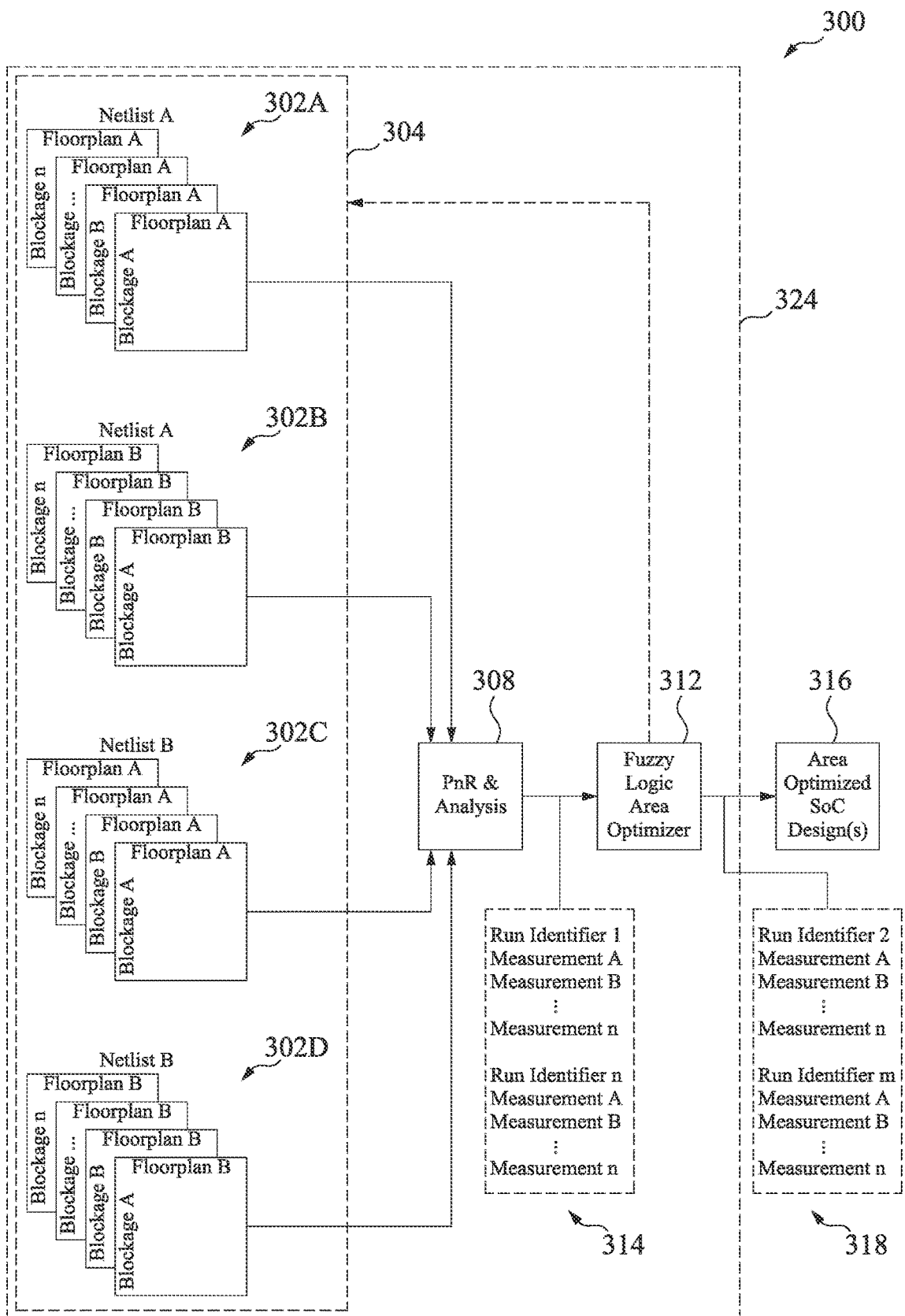
FIG. 3 is a block diagram illustrating an example optimization method in accordance with some embodiments.

FIG. 3 is a block diagram of an area optimization process that uses fuzzy logic processes in accordance with aspects of the present disclosure. A plurality of partitions and netlists 304 for example, may be provided to a PnR & Analysis component 308. The partitions may be, as a non-limiting example, any sized cell block, sub-block, IP core etc, including a netlist and proposed floorplan(s). For example, as depicted by reference character 302A, a floorplan, such as floorplan A, having one or more blockages, such as blockages A, B . . . n may be provided for a PnR run and subsequent analysis. During the PnR run, traces, pads, and/or other blockages may be added to the provided floorplan. Subsequent PnR runs may utilize the same floorplan but may include a blockage that incrementally increases with each run. As the goal of area optimization is generally to obtain a smallest physical design while still abiding by good design rules and techniques, overall area utilization for routing and component placement may be an indicator ultimately of an optimized area. That is, utilization may be a measure of the used chip, silicon, and/or die area divided by the total chip, silicon, and/or die area. The greater the calculated utilization, the less open area, or free area, there may be for routing traces and/or placing components. Stated another way, a low utilization would indicate that more chip, silicon, and/or die area is available than is needed. Thus, by incrementally increasing the size of the blockage, resulting in a decreased amount of chip, silicon, and/or die area for use in routing, an overall utilization may be increased.

Alternatively, or in addition, a plurality of floorplans (e.g., 302A, 302B, 302C, and/or 302D), may be provided to the PnR & Analysis component 308. Each of the floorplans may differ by size, shape, and/or blockages, while blockages may be provided for a same and/or different floorplan in an incrementally increased nature. For example, the Floorplan A in 302A and 302C may be different from floorplan B in 302B and/or 302D due in part a difference in blockage location. In some embodiments, a blockage may be incrementally increased such that a greater utilization may be obtained in accordance with a single floorplan. In other instances, a location of a blockage may be added, changed, or subtracted to/from a floorplan. In some instances, the netlists may be the same and/or different for each floorplan; thus, a different netlist utilizing a same floorplan and/or same size and/or location of blockages may be evaluated for increased area optimization.

A result of providing one or more netlists, one or more floorplans, and/or one or more blockages to the PnR & Analysis component 308 may include PnR run and analysis information 314 specific to each of the PnR runs. As one example, a run identifier may identify a specific floorplan having a specific blockage in which a specific netlist was utilized. Additionally, the PnR run and analysis information 314 may include one or more measurements indicative of the PnR run and subsequent analysis. As one example, the PnR run and analysis information 314 may include a collection of measurements that affect area, such as, but not limited to, timing, DRC, and shorts for example. That is, once a placement and routing (PnR) has occurred, the resulting netlist (including any changes and/or modifications to the original netlist), definition file, and/or timing information (either in a separate file format such as a standard Parasitic Extraction Format, or together with the definition file), may be analyzed to ensure the SoC design (e.g., floorplan, blockage, netlist, and routing) meets or exceeds design and/or functionality constraints and/or requirements, such as timing requirements for example. As one example, complete timing information may be analyzed in accordance with a static timing analysis (STA). The resulting analysis information may comprise at least a portion of the PnR run and analysis information 314.

The PnR run and analysis information 314, for each of the floorplans submitted to the PnR & Analysis component 308 may then be provided to a fuzzy logic area optimizer 312. Examples of fuzzy logic processes employed by the fuzzy logic area optimizer 312 are discussed below in conjunction with FIG. 7. The fuzzy logic area optimizer 312 may utilize fuzzy logic to determine criteria for evaluating the one or more measurements associated with each of the PnR runs, where each PnR run is for a floorplan, blockage, and/or netlist combination. The fuzzy logic area optimizer 312 may provide one or more designs 316, (e.g., netlists and/or floorplans having one or blockages) having an area optimization that provides an optimum usage of resources while minimizing the space required, and provide such information in the form of the area optimized SoC information 318. In some instances, the fuzzy logic area optimizer 312 may provide too many or too little designs. In some instances, the blockages may be increased and/or decreased at a finer granularity than originally provided. For example, rather than incrementally increasing a size of a blockage by 2%, a starting blockage may be increased by 0.1%. Alternatively, or in addition, the area of such blockage may be increased, or decreased, by any multiple of 0.1% for instance (e.g., 0.2%, 0.3% . . . 4.5% etc.). In some instances, the area of a blockage may be increased or decreased by a random quantity. As can be appreciated, the floorplans, netlists, and blockages may be stored at a storage location, such as in memory, and the PnR & Analysis component 308 and fuzzy logic area optimizer 312 may reside in a computing device 324 for example. Of course, the PnR & analysis component 308 and the fuzzy logic area optimizer 312 may reside in different computing devices.

Figure 4A:
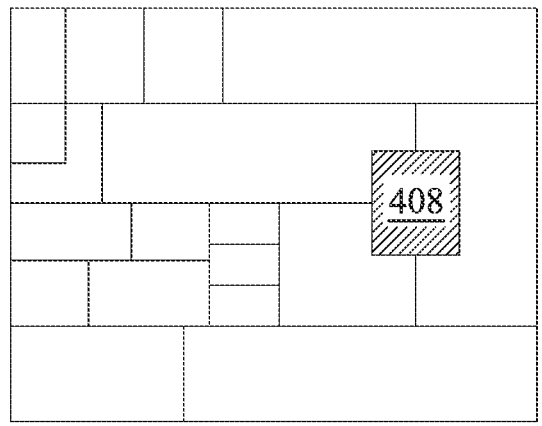
FIGS. 4A and 4B illustrate examples of integrated circuit floorplans in accordance with some embodiments.
Figure 4B:
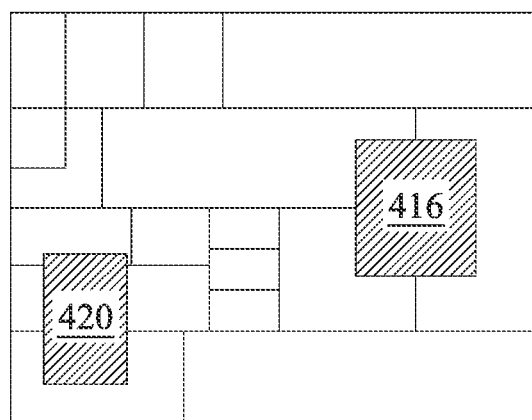

In accordance with embodiments of the present disclosure, FIGS. 4A and 4B illustrate examples of different blockages that may be analyzed and/or generated by the fuzzy logic optimizer 312. FIG. 4A depicts an SoC configuration 404 including a blockage 408. FIG. 4B illustrates another SoC configuration 412, which may include a larger blockage 416 for example, and/or a blockage 420 at a different location. The first SoC configuration may be a first floorplan for example, while the second SoC configuration 412 may be illustrative of the same floorplan having a blockage area of increased size and/or a different floorplan having the blockage 420.

Figure 5A:
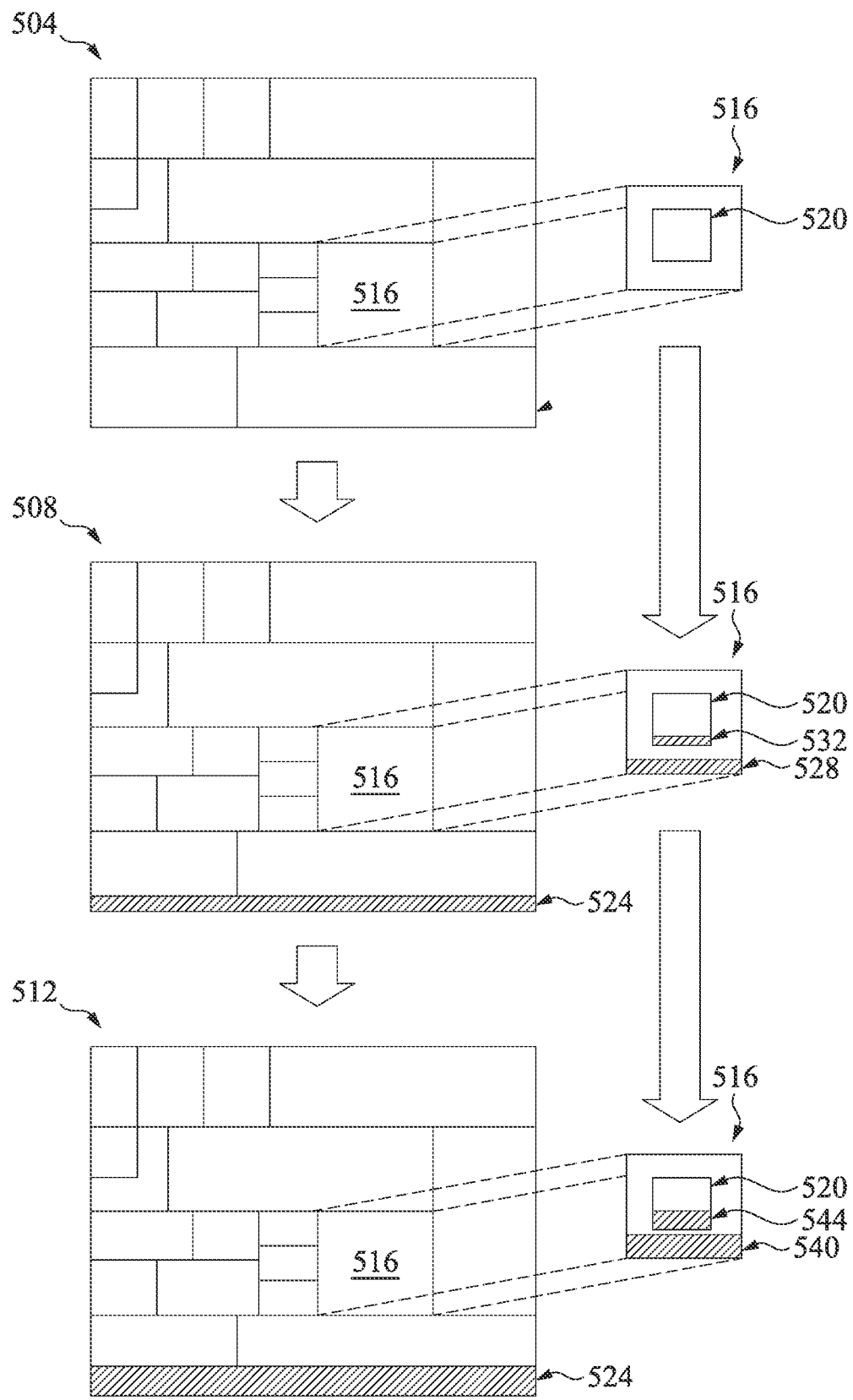
FIGS. 5A and 5B is are block diagrams illustrating examples of floorplan blockages in accordance with some embodiments.

FIG. 5A depicts additional details floorplans having different blockages. As depicted in FIG. 5A, a first SoC design 504 may include a block, component, cell, or sub block configuration 516. The block, component, cell, or sub block configuration 516 may first include a subcomponent 520. The first SoC design 504 and block, component, cell, or sub block configuration 516 may represent an initial starting area configuration, such as floorplan A having blockage A for a netlist A, such as depicted in FIG. 3. In accordance with embodiments of the present disclosure, a second SoC design 508 may be different from the first SoC design 504 by including one or more blockages, such as blockage 520, blockage 528, and/or blockage 532. Thus the area associated with the block, component, cell, or sub block configuration 516 and/or the SoC configuration may be reduced by providing additional functionality within a given area configuration or reducing the required area, and may correspond to a second configuration, such as floorplan A having blockage B for a netlist A, such as depicted in FIG. 3. Further, a third SoC design 512 may be different from the second and first SoC designs 504/508 by including one or more blockages, such as blockage 536, blockage 540, and/or blockage 544. Thus the area associated with the block, component, cell, or sub block configuration 516 and/or the SoC design may be reduced and may correspond to a second configuration, such as floorplan A having blockage B for a netlist A, such as depicted in FIG. 3. Blockage 536 may be incrementally larger than blockage 524; blockage 540 may be incrementally larger than blockage 528, and blockage 544 may be incrementally larger than blockage 532.

Figure 5B:
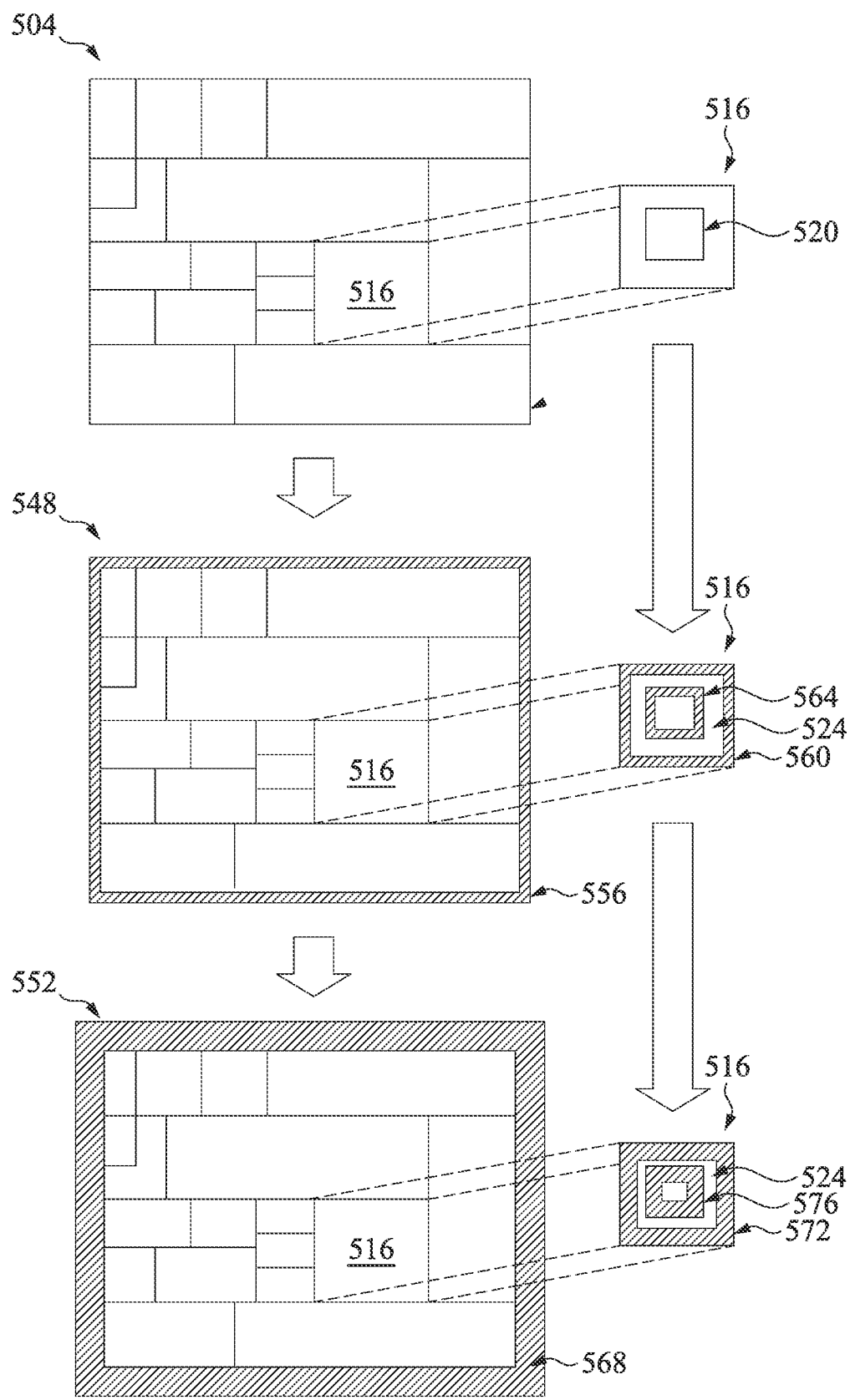

FIG. 5B depicts additional details of one or floorplans having different blockages. As depicted in FIG. 5B, a first SoC design 504 may include a block, component, cell, or sub block configuration 516. The block, component, cell, or sub block configuration 516 may first include a subcomponent 520. The first SoC design 504 and block, component, cell, or sub block configuration 516 may represent an initial starting area configuration, such as floorplan A having blockage A for a netlist A, such as depicted in FIG. 3. In accordance with embodiments of the present disclosure, a fourth SoC design 548 may be different from the first SoC design 504 by including one or more blockages, such as blockage 556, blockage 560, and/or blockage 564. Thus the area associated with the block, component, cell, or sub block configuration 516 and/or the SoC configuration may be reduced by providing further functionality in a given area or reducing the required area and may correspond to a second configuration, such as floorplan A having blockage B for a netlist A, such as depicted in FIG. 3 and/or may correspond to a floorplan B having a blockage B for netlist A. Further, a fifth SoC design 552 may be different from the fourth and first SoC designs 504/548 by including one or more blockages, such as blockage 568, blockage 572, and/or blockage 576. Thus the area associated with the block, component, cell, or sub block configuration 516 and/or the SoC design 552 may be reduced by providing further functionality in a given area or reducing the required area and may correspond to a second configuration, such as floorplan A having blockage B for a netlist A and/or may correspond to a floorplan B having a blockage C for netlist A, such as depicted in FIG. 3. Blockage 568 may be incrementally larger than blockage 556; blockage 572 may be incrementally larger than blockage 560, and blockage 576 may be incrementally larger than blockage 564.

Figure 6:
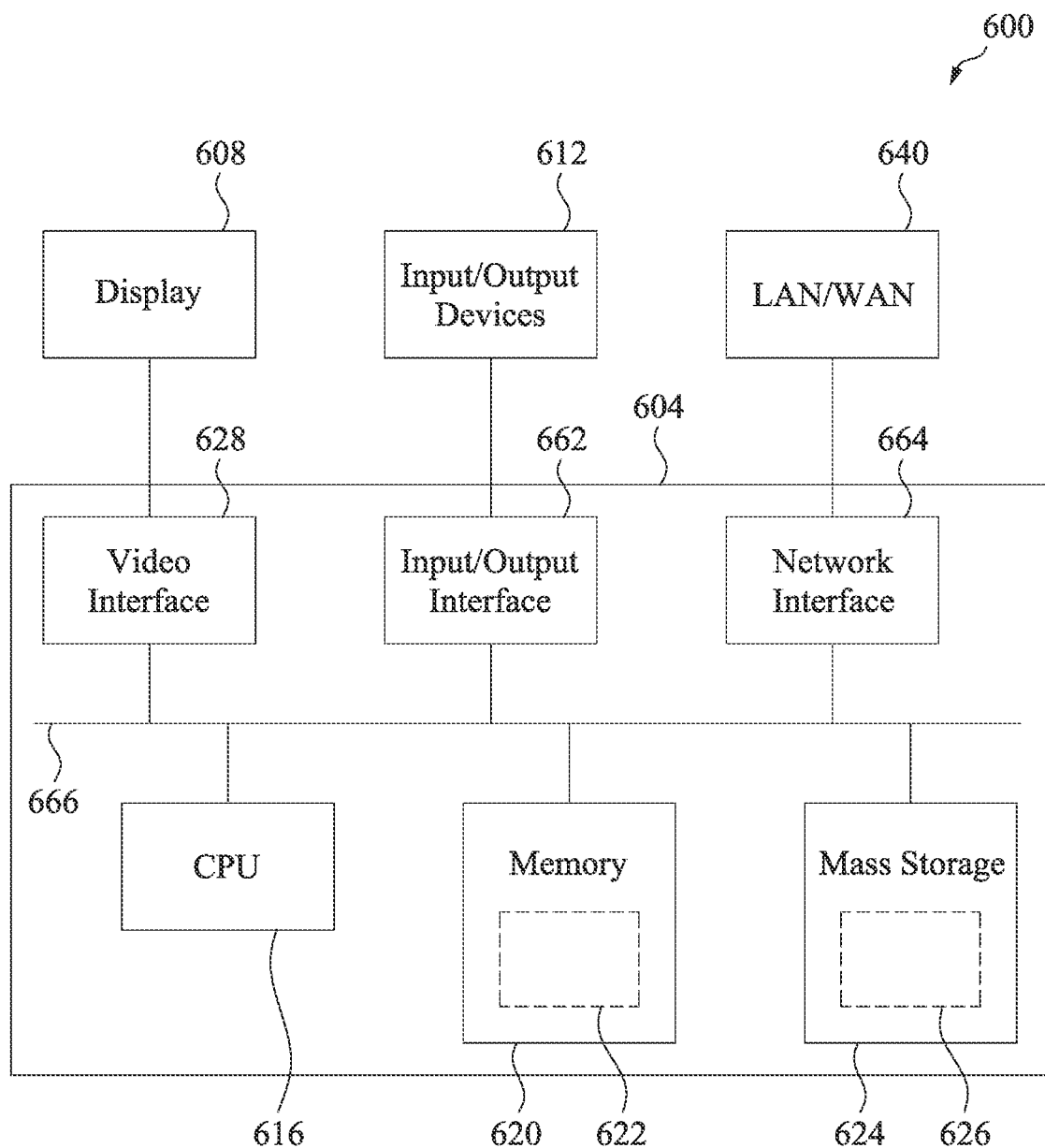
FIG. 6 is a block diagram illustrating aspects of an example processing system for an integrated circuit design system in accordance with some embodiments.

FIG. 6 is a block diagram illustrating an example of a processing system 600 in accordance with some embodiments disclosed herein. The processing system 600 may be used to implement various processes discussed herein, such as the PnR & analysis 308 and fuzzy logic area optimizer 312 modules shown in FIG. 3 and the design system of FIG. 7 discussed below. The processing system 600 includes a processing unit 604, such as a desktop computer, a workstation, a laptop computer, a dedicated unit customized for a particular application, a smart phone or tablet, etc. The processing system 600 may be equipped with a display 608 and one or more input/output devices 612, such as a mouse, a keyboard, touchscreen, printer, etc. The processing unit 604 also includes a central processing unit (CPU) 616, memory 620, a mass storage device 624, a video adapter 628, and an I/O interface 662 connected to a bus 666.

The bus 666 may be one or more of any type of several bus architectures including a memory bus or memory controller, a peripheral bus, or video bus. The CPU 616 may comprise any type of electronic data processor, and the memory 620 may comprise any type of system memory, such as static random access memory (SRAM), dynamic random access memory (DRAM), or read-only memory (ROM).

The mass storage device 624 may comprise any type of storage device configured to store data, programs, and other information and to make the data, programs, and other information accessible via the bus 636. The mass storage device 624 may comprise, for example, one or more of a hard disk drive, a magnetic disk drive, an optical disk drive, or the like.

The term "computer-readable media" as used herein may include computer storage media such as the system memory and storage devices mentioned above. Computer storage media may include volatile and nonvolatile, removable and non-removable media implemented in any method or technology for storage of information, such as computer readable instructions, data structures, or program modules. The memory 620 and mass storage device 624 are computer storage media examples (e.g., memory storage). Thus, computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the processing device 600. Any such computer storage media may be part of the processing device 600. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The video adapter 628 and the I/O interface 662 provide interfaces to couple external input and output devices to the processing unit 604. As illustrated in FIG. 6, examples of input and output devices include the display 608 coupled to the video adapter 628 and I/O devices 612, such as a mouse, keyboard, printer, and the like, coupled to the I/O interface 662. Other devices may be coupled to the processing unit 604, and additional or fewer interface cards may be utilized. For example, a serial interface card (not shown) may be used to provide a serial interface for a printer. The processing unit 604 may also include a network interface 664 that may be a wired link to a local area network (LAN) or a wide area network (WAN) 640 and/or a wireless link.

Embodiments of the processing system 600 may include other components. For example, the processing system 600 may include power supplies, cables, a motherboard, removable storage media, cases, and the like. These other components, although not shown, are considered part of the processing system 600.

In some examples, software code is executed by the CPU 616 to analyze a user design to obtain an integrated circuit layout and further optimize an area associated with the integrated circuit layout. The software code may be accessed by the CPU 616 via the bus 666 from the memory 620, mass storage device 624, or the like, or remotely through the network interface 664. As one non-limiting example, software code 622/626 may reside within one or more of the memory 620 or mass storage 624 for obtaining an integrated circuit layout and further optimizing an area associated with the integrated circuit layout.

Figure 7:
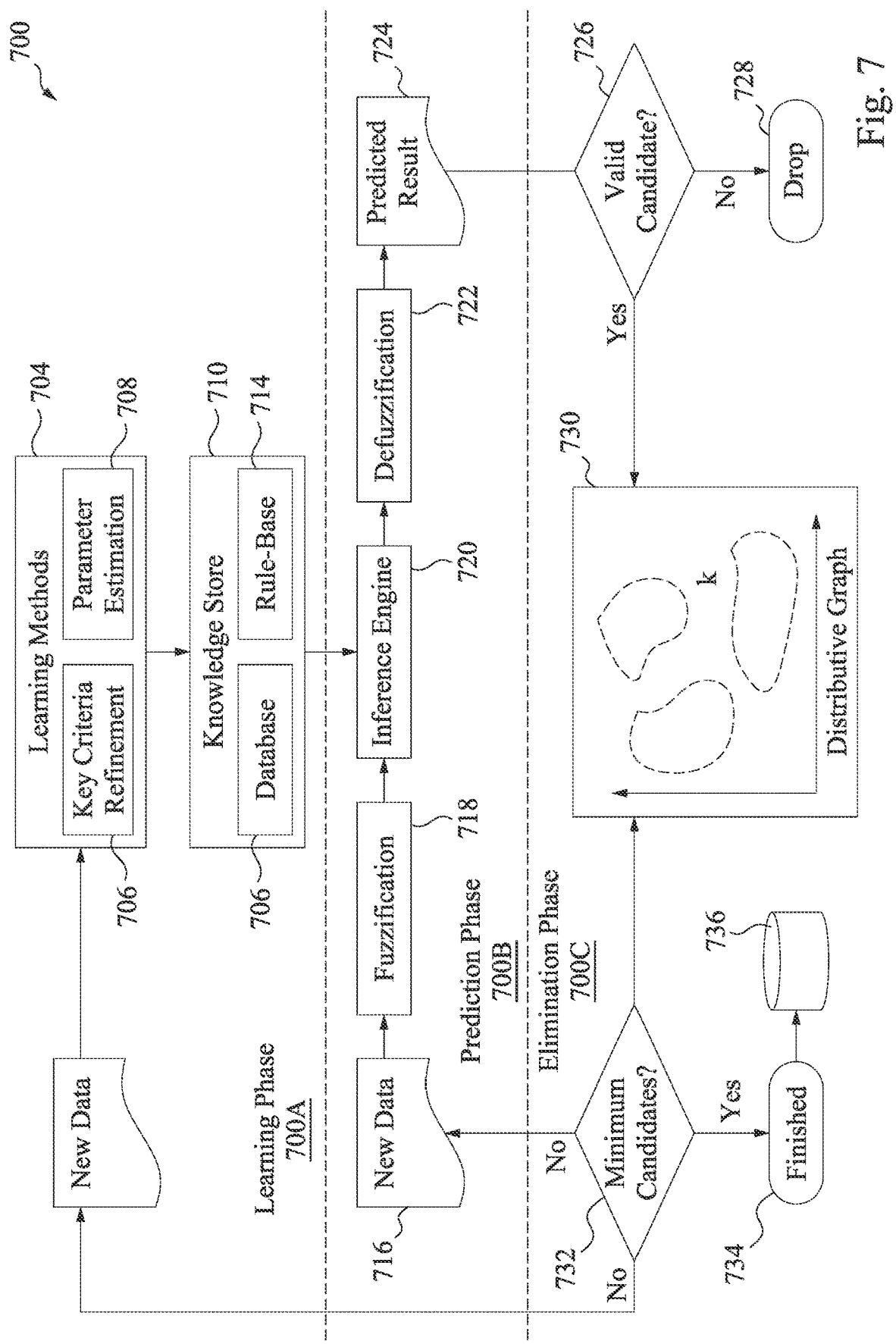
FIG. 7 is a block diagram illustrating further aspects of an integrated circuit design system in accordance with some embodiments.

FIG. 7 depicts aspects of utilizing a design process 700 to optimize an area associated with an integrated circuit layout in accordance with embodiments of the present disclosure. For instance, the fuzzy logic area optimizer 312 of FIG. 3 employs the design process 700 in some implementations. The design process 700 includes various phases such as a learning phase 700A, a prediction phase 700B, and an elimination phase 700C, for example. In general, a functional integrated circuit design is received, and various place and route PnR layouts are generated based on the received functional integrated circuit design and one or more integrated circuit floorplans. One or more fuzzy logic rules may be applied to analyze attributes associated with each of the generated PnR layouts. The learning phase 700A of the design process 700 may generate the fuzzy logic rules based on training data 702 applied to learning methods 704, and the fuzzy logic rules may be stored in the knowledge store 710.

The learning phase 700A thus includes training data 702 which may be provided to one or more learning methods 704. The training data 702 may include data that has been previously classified as optimized criteria and/or not optimized criteria and may be a collection of measurements that affect area, such as timing, DRC, area, shorts etc. for one or more netlists associated with one or more floorplans, such as the floorplans shown in FIGS. 4 and 5 discussed above. The training data 702 may be presented in feature vector form and in some instances may be refined based on the learning methods 704 such as key criteria refinement 706 and parameter estimation 708. More specifically, particular criteria may be applied to the training data 702 at the key criteria refinement block 706. At block 706, refinement of key range criteria provided by an initial parameter estimation 708 may be performed. For example, initial human judgment based parameters may be provided at 708; such parameters may be provided in the form of a range for a particular criteria affecting area optimization. As noted previously, fuzzy logic is a form of many-valued logic in which the truth values of variables may be any real number between 0 and 1 inclusive. In this manner, fuzzy logic may be utilized to handle the concept of partial truth, where the truth value may range between completely true and completely false. Fuzzy models or sets thus provide a mathematical means of representing vagueness and imprecise information. Such models are capable of recognizing, representing, manipulating, interpreting, and utilizing data and information that are vague and lack certainty. As one non-limiting example, a fuzzy range may be established for one or more criteria used for floorplan area optimization. If the value of the criteria falls outside of the parameters established by the fuzzy range (i.e. the criteria are not considered fuzzy), the value of the criteria may be considered to be crisp and may take on a crisp value indicating whether or not the value of the criteria satisfies the range parameter (e.g., Yes, No, 1, 0, low, medium, high) or may take a value indicative of a range (high, medium, low).

Initial ranges and parameters of the criteria for the parameter estimation function 708 may be provided in accordance with human and/or expert knowledge based on a designer's experience for example, to classify input range parameters, where the input range parameters may be utilized to fuzzify, or otherwise transform a numerical input value, such as a crisp value, into a fuzzy value, such as a fuzzy logic input value. In some instances, these initially provided classification ranges used for parameter estimation 708 may be refined at 706 utilizing machine learning and classification techniques. For example, based on one or more machine learning classification techniques, parameters (e.g., upper and/or lower limits) of the fuzzification ranges may be modified in accordance with one or more machine learning and/or classification models. Such machine learning and/or classification models may include one or more machine learning models configured to provide a parameter, such as utilization and floorplan area, given a set of inputs. Thus, the goal of machine learning is to predict an output based on given inputs and/or assign a set of observations into clusters such that the observations in the same cluster are similar in some manner. The machine learning techniques applied at learning methods 704 may employ supervised and/or unsupervised learning. That is, utilizing supervised learning, the training data 702 may include data that has already been classified as acceptable or unacceptable and/or valid or invalid. Accordingly, the initial parameters estimated at 708 may be refined in accordance with the training data 702 and a machine learning model using previously classified data. For example, the training data 702 may include block partitions with netlists and one or more proposed floorplans such as the floorplans shown in FIGS. 4 and 5, having incrementally increased, or decreased, blockages. As the goal of area optimization is generally to obtain a smallest physical design while still abiding by good design rules and techniques, overall area utilization for routing and component placement may be an indicator ultimately of an optimized area, and thus may be used to refine the training data. That is, utilization may be a measure of the used chip, silicon, and/or die area divided by the total chip, silicon, and/or die area. The greater the calculated utilization, the less open area, or free area, there may be for routing traces and/or placing components. Stated another way, a low utilization would indicate that more chip, silicon, and/or die area is available than is needed.

Moreover, and in accordance with embodiments of the present disclosure, machine learning models may train with data including partitions and netlists, or one or more PnR runs, applied to one or more proposed floorplans, where various partitions and netlists applied to one or more proposed floorplans will yield differing utilizations such as shown in the various utilization examples of FIGS. 5A-5B. Referring to FIG. 5A, in some instances, the floorplans 504, 508, 512 will differ by size, shape, and/or blockages. As noted previously, the blockage 516 varies in the configurations shown. Referring now to the floorplan and blockage examples shown in FIGS. 2A-2D, blocks A, B, and C may vary in size, location, functionality, etc. The various blockages A, B, C may incrementally increase in accordance with a PnR run, be placed at various partition locations in accordance with the PnR run, and combinations thereof, as previously discussed with respect to FIGS. 2, 4, and 5. Accordingly, the training data may also include other design constraints, such as but not limited to shorts, setup timing, power usage violation, design constraints found in a design constraint file, and/or other design constraints.

In some instances, the trained model may be trained with fuzzy logic values acting on partitions and netlists for one or more proposed floorplans, such as the floorplans 204, 208, 212, 216 shown in FIGS. 2A-2D. That is, one or more design constraints, together with a classified utilization, may fall into or out of, one or more fuzzy logic ranges (i.e. variables having a continuous range of values rather than precise values). Utilizing ranges of fuzzy logic to establish ranges of good criteria may allow a "best" optimized area, or alternatively a "best" utilized area, to be obtained based on fuzzy criteria applied to variables such as those associated partitions, netlists, floorplan layouts, etc. As one example, while the number of ideal shorts occurring between traces would ideally be zero (i.e. a distinct true/false or yes/no criterion), in actuality, a number of known shorts in a design may not be detrimental to the overall design. In other words, zero shorts would be ideal, but some number of shorts may be acceptable and different numbers of shorts may be classified into ranges of acceptance. Likewise, an ideal timing, such as setup timing, would be as close to zero as possible; however, a setup timing above zero is still acceptable in most situations. Moreover, setup timing may be localized to a particular location on the silicon, chip, and/or die. By allowing some shorts and an above zero timing to exist for example, a utilization for a SoC design may be higher than others, as some level of a criteria may be acceptable in the design. Thus, a fuzzy range (i.e. other than a non-binary yes/no or pass/fail criterion) establishing acceptable criteria may be used to optimize a utilization.

The learning phase 700A of the design process 700 may then flow to the knowledge store block 710, such that one or more rules 714 may be stored in a database or other storage location 712. That is, based on one or more of the estimated parameters 708, the refinement criteria 706, and/or a trained model trained utilizing the training data 702, one or more rule-bases may be created identifying attributes and/or fuzzy criteria resulting in optimized utilizations as described above may then be stored in a database 712 together with a rule-base 714 identifying combinations of valid and invalid rules. The database 712 may reside at the memory 620, mass storage device 624, and/or at a network location accessible via the network interface 644 shown in FIG. 6.

Each of the rules may identify a combination of fuzzified (e.g. continuous values between 0-1) and/or crisp classifications (e.g. 1/0, yes/no, etc.) of criteria values and a resulting indication as to whether such combinations are valid (e.g., satisfying design criteria established by human knowledge and/or machine learning techniques). In some instances, the rule-base 714 may contain rules where each combination of criteria is combined in some manner (such as a summation) to result in an output; the output may then be determined as to whether it falls into one more ranges, such as a Yes-Crisp Range, Fuzzy-Range (somewhere between yes and no), and/or No-Crisp Range, for example. The output value may determine whether such resulting summed output is valid in accordance with the class, where a binary value such as "1" may indicate that such summed output is valid and a "0" may indicate that such summed output is not valid. In instances where the summed output results in an output value that falls into a fuzzy range, expert knowledge and/or machine learning techniques may be utilized to determine whether the combination of criteria results in a valid output, where a valid output indicates that such combination of criteria satisfies design criteria ranges, such as an acceptable or unacceptable number of shorts, setup timing, etc. For example, criteria satisfying crisp yes ranges may result in an output value falling within a crisp class; such crisp class may implicitly result in a valid output. In some instances, a rule may be defined as requiring input (i.e. human input) to reside in a specified fuzzified class. Additional detailed non-limiting examples are provided with respect to Tables 1 and 2 below.

TABLE 1

|  | Low | Med | High |
| --- | --- | --- | --- |
| Shorts | <=100 | 100 < x < 500 | >=500 |
| Utilization | <=60% | 60% < x < 68% | >=68% |
| Setup Timing (ns) | <=100 ns | 100 < x < 500 ns | >=500 ns |

TABLE 2

|  | Shorts | Utilization | Setup Timing (ns) | Class | Output Value |
| --- | --- | --- | --- | --- | --- |
| Rule A | low | high | low | Crisp | 1 |
| Rule B | low | reasonable | low | Crisp | 1 |
| Rule C | low | reasonable | low | Fuzzy | 1 |
| Rule D | low | reasonable | reasonable | Fuzzy | 0 |

As indicated in Tables 1 and 2, if Rule A was applied to data resulting from a PnR run and analysis having a low short (<=100), a high utilization (>=68%), and low setup timing (<=100 ns), the rule may result in a crisp output classification and further result in a valid output (e.g., 1). If Rule B was applied to data resulting from a PnR result and analysis having a low short (<=100), a medium or reasonable utilization (66), and a low setup timing (<=100 ns), again the application of the rule to the PnR run results may yield a crisp-output classification and further result in a valid output (e.g., 1). If Rule C was applied to data from a PnR result and analysis having a low short (<=100), a medium or reasonable utilization (66%), and a low setup timing (<=100 ns), the application of the rule to the PnR result may result in a Fuzzy output classification but may result in a valid output (e.g., 1). In such instance, expert knowledge of a human may have been involved in establishing the Fuzzy-Range. If Rule D was applied to data from a PnR result and analysis having a low short (<=100), a medium or reasonable utilization (61%), and a medium or reasonable setup timing (490 ns), the application of the rule to the PnR run result may yield a Crisp output classification and an invalid output (e.g., 0). It may also be possible to apply Rule D to the same PnR result and analysis having a low short (<=100), a reasonable utilization (61%), and a reasonable setup timing (490 ns), yet have the PnR result fall within a Fuzzy output classification that would result in an invalid output (e.g., 0) depending on applied human input, for example.

Each of the previously discussed crisp-no-range, fuzzy-range, and crisp-yes-range may be established using one or more previously described machine learning processes. For example, training data including PnR runs determined to be valid may be provided to the learning methods 704 such that range parameters may be estimated at 708, where the range parameters indicate the upper and/or lower limits of each of the crisp-range-no, fuzzy-range, and crisp-range-yes criteria may be modified and refined based on the training data. Although the examples above illustrate an optimized area criteria set having three ranges, additional ranges and/or criteria is contemplated. For instance, an additional Fuzzy range for Low-Med shorts may be established etc.

A PnR layout having an area utilization complying with one or more of fuzzy logic rules from the knowledge store may then be determined. For instance, the rule-base 714 may be provided from the database 712 to the inference engine 720 during the prediction phase 700B. Accordingly, new data 716, from a PnR run for example, may be fuzzified (e.g. assigned to criteria ranges) at 718. The new data 716 may correspond to a netlist and floorplan having a blockage as previously discussed with respect to FIG. 3. The new data 716 may result from PnR processes applied to partitions and netlists of multiple proposed floorplans, where the various partitions and netlists applied to the multiple proposed floorplans will yield differing results, such as timing and utilization for example. Accordingly, in some instances, the floorplans will differ by size, shape, and/or blockages, where the blockages may incrementally increase in accordance with each PnR run, be placed at various partition locations in accordance with each PnR run, and combinations thereof. For example, between each PnR run using a same floorplan, a blockage may be increased incrementally by 2%. Alternatively, or in addition, a different floorplan may be utilized, where the different floorplan has a different shape and/or a different location of a blockage. Thus, multiple PnR runs may be applied to the second floorplan such that an area of a blockage is different between each of the PnR runs to determine a blockage for the floorplan that, for example, provides a small physical design while still satisfying other design criteria.

The new data 716 may result from the same netlist(s) and partition(s) being applied to differing floorplans and/or different area blockages for each of the floorplans. The result of each PnR run may be stored in one or more of the memory 620 and/or mass storage device 624 and/or accessible via the network interface 664. A non-limiting example of new data 716 resulting from the PnR run is illustrated in Table 3 below.

TABLE 3

| Run ID | Shorts | Utilization | ... | Timing Setup (ns) |
|---|---|---|---|---|
| 1 | 47 | 68.15% | ... | 73 |
| 2 | 19 | 71.95% | ... | 24 |
| 3 | 25 | 68.83% | ... | 186 |
| 4 | 174 | 74.60% | ... | |
| 5 | 107 | 73.84% | ... | 101 |
| ... | 60 | 74.97% | ... | 92 |
| n | 177058 | 77.59% | ... | |

The resulting data 716 of each PnR run shown above in Table 3 may then be fuzzified at 718 to convert the discreet PnR data measurements into fuzzy values and result in a table similar to Table 4 below, where fuzzification criteria may establish low (L), medium (M) or High (H) limits of each of the criteria based on table 5 for example.

TABLE 4

| Run ID | Shorts (Low/Medium/High) | Utilization | ... | Timing Setup (ns) |
|---|---|---|---|---|
| 1 | L | H | ... | L |
| 2 | L | H | ... | L |
| 3 | L | H | ... | M |
| 4 | M | H | ... | |

TABLE 4-continued

| Run ID | Shorts (Low/Medium/High) | Utilization | ... | Timing Setup (ns) |
|---|---|---|---|---|
| 5 | M | H | ... | M |
| ... | L | H | ... | L |
| n | H | H | ... | |

TABLE 5

| Short | Utilization | Output Value |
|---|---|---|
| Low | High | 1 |
| High | Low | 0 |
| Medium | High | 1 |
| Medium | Medium | 0 |

At the inference engine 720, the rule-base 714 may be applied to the fuzzified criteria, where each rule of the rule-base 714 is fired against the fuzzified new data 716 from each PnR run by the inference engine 720. In some instances, multiple rules may be applied to a single PnR run. In other instances, the application of one or more rules of the rule-base 714 may produce an output value during defuzzification 722 as described above in conjunction with Table 2 and provide an output value similar to Table 6 below to provide low (L), medium (M) or High (H) classifications for the data and crisp (C) or fuzzy (F)output classifications. That is, defuzzification is the process of producing a quantifiable result in crisp logic, given fuzzy sets and corresponding membership degrees; defuzzification is the process that maps a fuzzy set to a crisp set. The output value may be indicative of predicted PnR layouts having an area utilization complying with one or more of the fuzzy logic rules from the knowledge store 710 as shown at step 724 of the prediction phase 700B.

TABLE 6

| Run ID | Shorts | Utilization | ... | Timing Setup (ns) | Fuzzyfication Class | Output Value |
|---|---|---|---|---|---|---|
| 1 | L | ... | ... | L | C | 1 |
| 2 | L | ... | ... | L | C | 1 |
| 3 | L | | ... | M | C | 1 |
| 4 | M | ... | ... | | F | 1 |
| 5 | M | ... | ... | M | F | 1 |
| ... | L | ... | ... | L | C | 1 |
| n | H | ... | ... | | C | 0 |

In some instances, the design process may end with a predicted result 724, where the netlist, partition, and floorplan associated with a Run ID having parameters closest to ideal design requirements may be obtained and utilized for further SoC fabrication. However, in some instances, the netlist, partition, and floorplan associated with a Run ID having measured parameters closest to ideal design requirements may not have the greatest, or best, utilization (area optimization). Accordingly, an elimination phase 700C may be entered where PnR runs may be eliminated based on one or more additional classification techniques. For example, at 726, if a PnR run is not valid, such as run n illustrated above in Table 6 with a crisp output value 0, the PnR run may be dropped from further consideration at step 728. Accordingly, the elimination phase 700C of the design process 700 may proceed to classify each of the remaining PnR runs (e.g., Run Ids 1– ... in Table 6). In accordance with embodiments of the present disclosure, a machine learning algorithm such as a nearest neighbor search may be performed at step 730 such that the top k results (where k is a variable) closest to one another in terms of highest area utilization, floorplan, and/or area blockage such as shown in Table 6, may be identified. As one example, an output, such as an output depicted in Table 7 may be obtained which shows nearest neighbor data for shorts, utilization, timing setup, fuzzification class (crisp (C) or fuzzy (F)) and the nearest neighbor ranking.

TABLE 7

| Run ID | Shorts | Utilization | Timing Setup (ns) | Fuzzy-fication Class | DeFuzzy-fication Ouput | k-NN Rank |
|---|---|---|---|---|---|---|
| 1 | 47 | 68.15 | 73 | C | 1 | |
| 2 | 19 | 71.95 | ... | C | 1 | 4 |
| 3 | 25 | 68.83 | 186 | C | 1 | 5 |
| 4 | 174 | 74.6 | ... | F | 1 | 2 |
| 5 | 107 | 73.84 | 101 | F | 1 | 3 |
| ... | 60 | 74.97 | 92 | C | 1 | 1 |
| n | 177058 | 77.59 | ... | C | 0 | |

In some instances, the design process may end with a predicted result 724, where the netlists for each of the remaining PnR runs satisfy area optimization criteria. For example, if the number of top k results identified in 730 is less than and/or equal to a minimum number of candidates as determined at the decision block 732, the elimination phase 700C of the design process 700 may end at 734 and the PnR runs identified at 724 may be stored at 736 in one or more storage locations, for example the mass storage device 624 and/or the memory 620.

If the resulting classification of the PnR runs at 730 yields a quantity of PnR runs (e.g., number of top k results) that exceeds the minimum quantity of candidate PnR runs at 732, the top k candidate PnR runs may be provided back to the prediction phase 700B and/or the learning phase 700A. That is, in accordance with embodiments of the present disclosure, the top k candidate PnR runs may be used to adjust, and/or refine, one or more of the criteria utilized to fuzzify the inputs provided into the design process 700. For example, the utilization may be refined such that different upper and lower limits define the Low, Medium, and High fuzzy classes, as illustrated in Table 8. Accordingly, the inference engine 720 may act on the same PnR netlists and other criteria utilizing different fuzzy classes; thus, during defuzzification 722, valid output values for the PnR runs may coincide with the refined limits.

TABLE 8

| | Low | Med | High |
|---|---|---|---|
| Shorts | <=100 | 100 < x < 500 | >=500 |
| Utilization | <=72.84% | 72.84% < x < 74.6% | >=74.6% |
| Setup Timing (ns) | <=100 ns | 100 < x < 500 ns | >=500 ns |

Alternatively, or in addition, if the resulting classification of the PnR runs at 730 yields a quantity of PnR runs (e.g., number of top k results) that exceeds the minimum quantity of candidate PnR runs at 732, blockages of an initial SoC design corresponding to the top k candidate PnR runs may be modified (e.g., increased or decreased) in a more granular manner of refinement in the learning phase 700A. For instance, an average blockage size of the top k candidate PnR runs may be obtained for a specific netlist and floorplan; the blockage may then be increased in an incremental manner in step 716. In some instances, instead of increasing a blockage area by 2%, it may be increased by 1%. In other instances, rather than incrementally increasing a size of a blockage by 2%, a starting blockage may be increased by 0.1%. Alternatively, or in addition, the area of such blockage may be increased, or decreased, by any multiple of 0.1% for instance (e.g., 0.2%, 0.3% ... 4.5% etc.). In some instances, the area of a blockage may be increased or decreased by a random quantity.

Accordingly, the tightened criteria from the knowledge store 710 may be applied to the previous PnR runs and/or the PnR runs having differing area blockages in the prediction phase 700B. Such additional predicted results may be classified again at step 730 according to the nearest neighbor algorithm, for example, to identify the top k results (where k is a variable) closest to one another, such that as one example, an output, such as an output depicted in Table 9 may be obtained.

TABLE 9

| un ID | Shorts | Utilization | Timing Setup (ns) | Fuzzy-fication Class | DeFuzzy-fication Ouput | k-NN Rank |
|---|---|---|---|---|---|---|
| 1 | 10 | 72.5 | 90 | C | 0 | |
| 2 | 50 | 73.5 | 170 | F | 1 | 3 |
| 3 | 100 | 74.5 | 186 | F | 1 | 2 |
| 4 | 200 | 75.5 | 120 | F | 1 | 1 |
| 5 | 1000 | 76.5 | 101 | C | 0 | |
| ... | 170K | 77.5 | 92 | C | 0 | |
| n | 200K | 78.5 | 110 | C | 0 | |

Thus, for example, a Run ID corresponding to a floorplan, blockage, and netlist may be identified having a greatest utilization while still obtaining the best timing and shorts results as defined by the refined fuzzification rules (e.g., Table 8).

Figure 8:
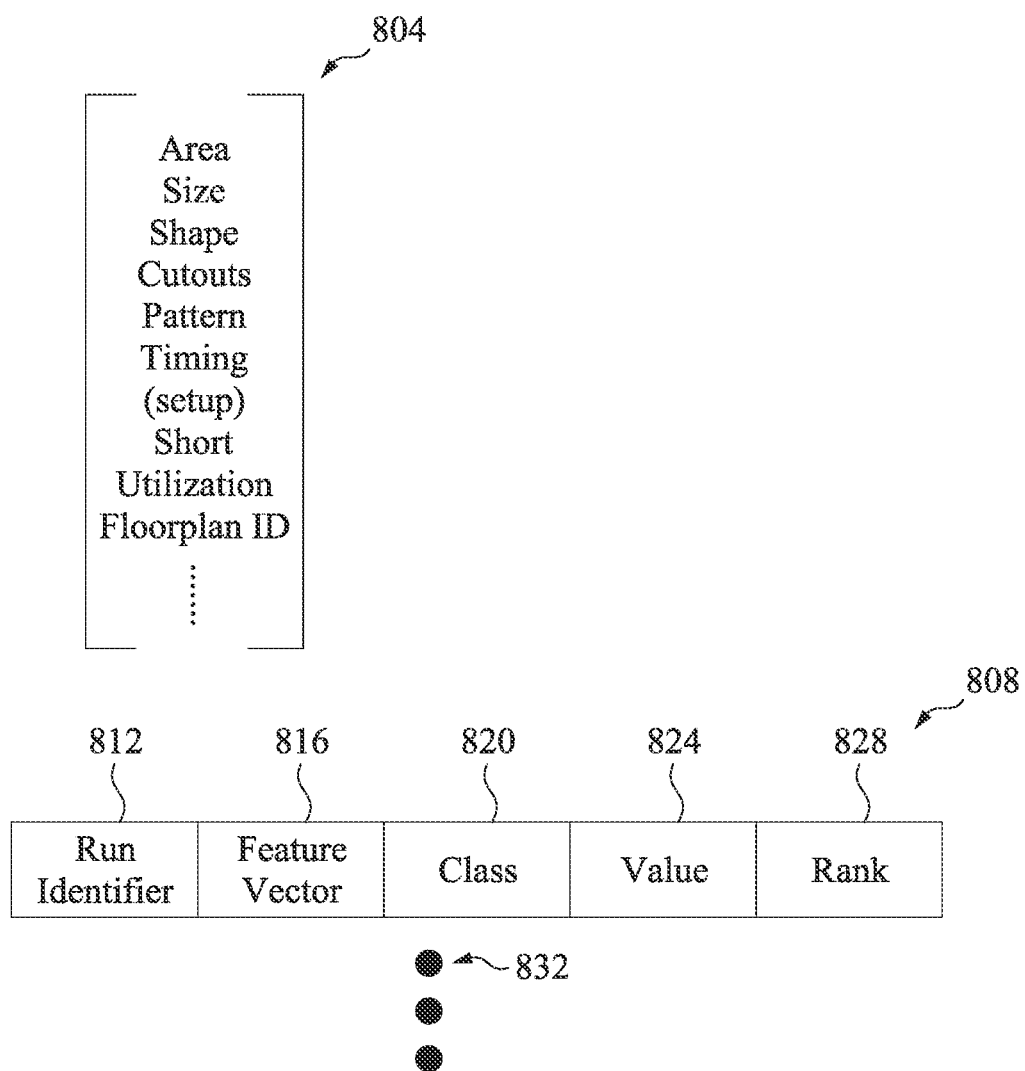
FIG. 8 illustrates examples of PnR run and analysis information for the system of FIG. 7 in accordance with come embodiments.

FIG. 8 depicts additional details of the PnR run and analysis information 314 and area optimized SoC information 318 for example in a table 804. Each of the PnR run and analysis information 314 and area optimized SoC information 318 may include one or more piece of information applicable to a specific PnR run and subsequent analysis. For example, an area of an SoC design, a size, a shape, cutouts, patterns, timing, setup timing, number of anticipated shorts, an overall utilization, and an identifier specific to a floorplan may be provided. Alternatively, or in addition, in table 808 additional details of one or more feature vectors is provided depicting details of PnR run and analysis information 314, area optimized SoC information 318, and/or information acquired through the classification step 820. For example, the table 808 may include a run identifier 812 identifying a floorplan, blockage, and/or netlist utilized for the PnR run and analysis. The table may include a particular feature vector 816 including measurements, such as those identified in the table 804 and/or other pieces of information applicable to a specific PnR run and subsequent analysis. Moreover, the table 808 may include a classification 820 of the output from the predicted step (e.g., 724), and/or a value 824 of the predicted output 724. Lastly, following a classification and ranking process at step 820, the feature vector 808 may include ranking information 828 for each PnR run. Thus, the top n results may be provided as an output of the fuzzy logic area optimization process 700.

Figure 9:
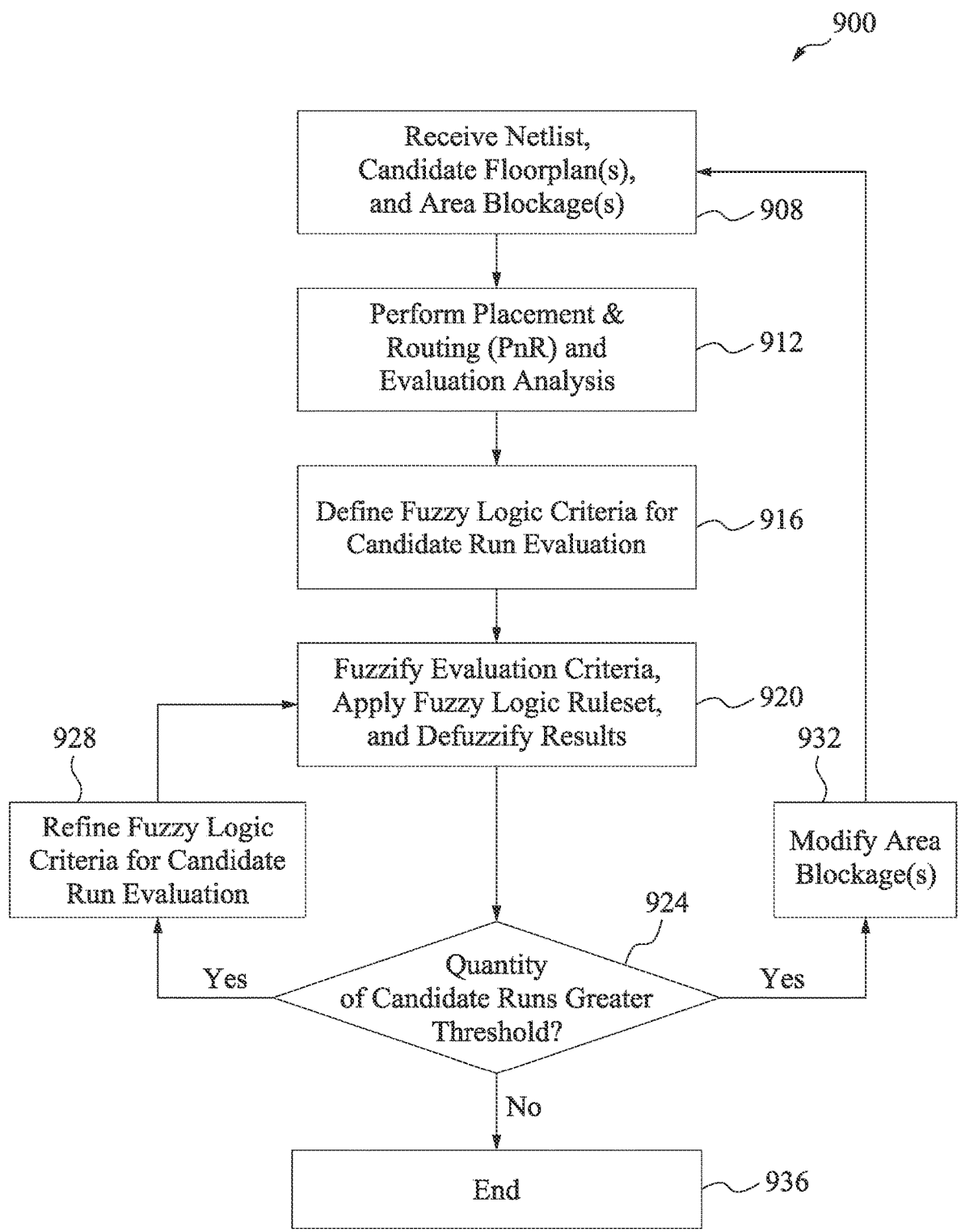
FIG. 9 is a process flow diagram illustrating an example of a method for generating an integrated circuit in accordance with some embodiments.

FIG. 9 depicts additional details of a method 900 in accordance with embodiments of the present disclosure. That is, a method 900 for generating an SoC design based on a fuzzy logic classification and machine learning algorithm may be provided as depicted in FIG. 9. The method 900 can include more or fewer steps or can be arranged in an order of steps differently than those shown in FIG. 9. The method 900 can be executed as a set of computer-executable instructions executed by a computer system and encoded or stored on a computer readable medium such as in the example computer processing system shown in FIG. 6. Further, the method 900 can be performed by gates or circuits associated with a processor, Application Specific Integrated Circuit (ASIC), a field programmable gate array (FPGA), a system on chip (ScC), or other hardware device. Hereinafter, the method 900 shall be explained with reference to the systems, components, modules, software, data structures, user interfaces, etc. described in conjunction with FIGS. 1-8.

In method 900, at step 908, one or more netlists, candidate floorplans, and area blockages, such as those depicted in FIGS. 3-5B, are received. At step 912, PnR and analysis is performed, resulting in floorplans and measurements for each of the PnR runs as previously discussed. At step 916, the floorplans and measurements may be utilized to define criteria for establishing one or more classes of a fuzzy logic classifier for fuzzification of the measurements as input data. At step 920, one or more rulesets, such as those previously described, may be fired to evaluate the measurements in accordance with the fuzzy classes previously established and produce a predicted result for each of the PnR runs (e.g., floorplan having undergone a PnR and analysis process). The results from step 920 may be classified, and/or grouped, and further evaluated at 924 to determine if a quantity of the resulting PnR runs is greater than a threshold. If so, the method may proceed to step 928, where one or more fuzzy logic rule sets may be refined and/or fuzzification criteria may be refined. Accordingly, the results the previously utilized PnR and subsequent analysis subjected to different fuzzification criteria and/or output rules may be obtained at step 920. Alternatively, or in addition, the method 900 may proceed from step 924 to step 932 if the quantity of the resulting PnR runs is greater than a threshold as determined in step 924, where an area associated with one or more blockages of a floorplan may be modified by incrementally increasing and/or decreasing such area in a manner that is more granular than previously increased and/or decreased. Accordingly, the method 900 may proceed to step 908 where the steps 908 to 924 may be repeated using new PnR run and subsequent analysis information. Method 900 may end at step 936 when a number of PnR runs satisfying a predetermined quantity criteria occurs.

Embodiments in accordance with the present disclosure may include a method including receiving a functional integrated circuit design, generating a plurality of place and route (PnR) layouts based on the received functional integrated circuit design and one or more integrated circuit floorplans, applying one or more fuzzy logic rules to analyze attributes associated with each of the generated PnR layouts, and determining a PnR layout of the plurality of PnR layouts having an area utilization complying with the one or more fuzzy logic rules.

Further disclosed embodiments may include an area optimization system on chip (SoC) designer, including a processor, a database accessible by the processor storing fuzzy logic rules, and computer-readable media accessible by the processor, the computer-readable media storing instructions that when executed by the processor implement a method that includes receiving a functional integrated circuit design, generating a plurality of place and route (PnR) layouts based on the received functional integrated circuit design and one or more integrated circuit floorplans, applying one or more fuzzy logic rules to analyze attributes associated with each of the generated PnR layouts, and determining a PnR layout of the plurality of PnR layouts having an area utilization complying with the one or more fuzzy logic rules. At least one aspect of the above embodiment may include modifying at least one of fuzzification criteria, one or more logic rules, and/or one or more floorplans.

Other embodiments may include a computer-readable medium including one or more instructions, which when executed by a processor, cause the processor to receive a functional integrated circuit design, generate a plurality of place and route (PnR) layouts based on the received functional integrated circuit design and one or more integrated circuit floorplans, and for each of the generated plurality of PnR layouts, apply one or design analyses to the PnR layout to generate attributes associated with the PnR layout, fuzzify the attributes, generate an output based on the one or more fuzzy logic rules, and defuzzify the output, and determine a PnR layout of the plurality of PnR layouts having an area utilization complying with the one or more fuzzy logic rules.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a functional integrated circuit design;
generating a plurality of place and route (PnR) layouts based on the received functional integrated circuit design and first and second integrated circuit floorplans, the first integrated circuit floorplan including a first blockage having a same shape and size as a first blockage in the second integrated circuit floorplan;
applying one or more rules to analyze attributes associated with each of the generated PnR layouts, wherein the rules include variables having truth values that may be any real number between 0 and 1 inclusive; and
determining a PnR layout of the plurality of PnR layouts having an area utilization complying with the one or more rules.

2. The method of claim 1, wherein the rules are fuzzy logic rules, and wherein applying the rules to analyze the generated PnR layouts includes:
for each of the plurality of PnR layouts:
applying one or design analyses to the PnR layout to generate the attributes associated with the PnR layout;
fuzzifying the attributes;
generating an output based on the one or more fuzzy logic rules; and
defuzzifying the output.

3. The method of claim 2, further comprising:
classifying and ranking the plurality of PnR layouts based on at least the area utilization.

4. The method of claim 2, further comprising locating a second blockage at a same location in each of the first and second integrated circuit floorplans, wherein the second blockage in each of the first and second integrated circuit floorplans is different from another blockage in the first and second integrated circuit floorplans.

5. The method of claim 4, wherein a size of each second blockage is different from a size of another blockage.

6. The method of claim 2, further comprising:
modifying the one or more fuzzy logic rules based on the determined PnR layout of the plurality of PnR layouts having an area utilization complying with the one or more fuzzy logic rules.

7. The method of claim 2, further comprising:
modifying fuzzification criteria, utilized to fuzzify the attributes, based on the determined PnR layout of the plurality of PnR layouts having an area utilization complying with the one or more fuzzy logic rules.

8. The method of claim 1, further comprising:
generating a knowledge database based on the plurality of PnR layouts having an area utilization complying with the one or more fuzzy logic rules.

9. The method of claim 1, further comprising:
manufacturing a system on chip based on the PnR layout of the plurality of PnR layouts having an area utilization complying with the one or more fuzzy logic rules.

10. A system, comprising:
a processor;
a database accessible by the processor storing fuzzy logic rules;
computer-readable media accessible by the processor, the computer-readable media storing instructions that when executed by the processor implement a method, comprising:
receiving a functional integrated circuit design,
generating a plurality of place and route (PnR) layouts based on the received functional integrated circuit design and one or more integrated circuit floorplans,
applying one or more of the fuzzy logic rules stored in the database to analyze attributes associated with each of the generated PnR layouts,
determining a PnR layout of the plurality of PnR layouts having an area utilization complying with the one or more fuzzy logic rules,
classifying and ranking the plurality of PnR layouts based on at least the area utilization selecting a portion of the classified and ranked plurality of PnR layouts based on at least the area utilization, and
modifying at least one of fuzzification criteria, one or more logic rules, and/or one or more floorplans.

11. The system of claim 10, wherein the one or more floorplans includes a first floorplan and a second floorplan different from the first floorplan, the first floorplan including a blockage having a same shape and size as a blockage in the second floorplan.

12. The system of claim 10, wherein the method of applying the fuzzy logic rules to analyze the generated PnR layouts includes:
for each of the plurality of PnR layouts:
applying one or design analyses to the PnR layout to generate the attributes associated with the PnR layout;
fuzzifying the attributes;
generating an output based on the one or more fuzzy logic rules; and
defuzzifying the output.

13. The system of claim 12, wherein the database is stored in the computer readable media.

14. The system of claim 12, wherein the method further comprises:
applying one or more of the fuzzy logic rules to analyze attributes associated with each of the classified and ranked plurality of PnR layouts; and
determining a second PnR layout of the plurality of PnR layouts having an area utilization complying with the applied one or more fuzzy logic rules.

15. The system of claim 10, wherein the method further comprises:
systematically altering a blockage at a same location in each of the one or more integrated circuit floorplans.

16. The system of claim 10, wherein the method further comprises:
modifying the one or more of the fuzzy logic rules based on the determined PnR layout of the plurality of PnR layouts having an area utilization complying with the one or more fuzzy logic rules.

17. The system of claim 10, wherein the method further comprises:
modifying fuzzification criteria, utilized to fuzzify the attributes, based on the determined PnR layout of the plurality of PnR layouts having an area utilization complying with the one or more fuzzy logic rules.

18. The system of claim 10, wherein the method further comprises:
generating a knowledge database based on the plurality of PnR layouts having an area utilization complying with the one or more fuzzy logic rules.

19. A computer-readable medium including one or more instructions, which when executed by a processor, cause the processor to:
receive a functional integrated circuit design;
generate a plurality of place and route (PnR) layouts based on the received functional integrated circuit design and one or more integrated circuit floorplans; and
for each of the generated plurality of PnR layouts:
apply one or design analyses to the PnR layout to generate attributes associated with the PnR layout,
fuzzify the attributes,
generate an output based on the one or more fuzzy logic rules; and
defuzzify the output, and
determine a PnR layout of the plurality of PnR layouts having an area utilization complying with the one or more fuzzy logic rules.

20. The computer-readable medium of claim 19, wherein the one or more instructions cause the processor to:
select a portion of the plurality of PnR layouts based on at least the area utilization;
modify at least one of fuzzification criteria, one or more logic rules, and/or one or more floorplans;
apply one or more different fuzzy logic rules to analyze attributes associated with each of the plurality of PnR layouts; and
determine a second PnR layout of the plurality of PnR layouts having an area utilization complying with the applied one or more fuzzy logic rules.

* * * * *